United States Patent
Storaska et al.

(10) Patent No.: US 8,183,950 B2
(45) Date of Patent: *May 22, 2012

(54) AUTO-CALIBRATION FOR RING OSCILLATOR VCO

(75) Inventors: Daniel W. Storaska, Walden, NY (US); Michael A. Sorna, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/365,921

(22) Filed: Feb. 5, 2009

(65) Prior Publication Data

US 2010/0194483 A1 Aug. 5, 2010

(51) Int. Cl.
*H04B 1/06* (2006.01)
(52) U.S. Cl. ............... 331/179; 331/16; 331/17
(58) Field of Classification Search .............. 331/16, 331/17, 179
See application file for complete search history.

(56) References Cited

U.S. PATENT DOCUMENTS

| | | | |
|---|---|---|---|
| 6,466,100 B2 | 10/2002 | Mullgrav, Jr. et al. | |
| 6,661,267 B2 | 12/2003 | Walker et al. | |
| 6,949,981 B2 | 9/2005 | Natonio et al. | |
| 7,142,623 B2 | 11/2006 | Sorna | |
| 7,269,402 B2 * | 9/2007 | Uozumi et al. | 455/255 |
| 2005/0062551 A1 * | 3/2005 | Coppola et al. | 331/36 C |
| 2005/0137816 A1 | 6/2005 | Chuang et al. | |
| 2007/0205835 A1 * | 9/2007 | Iozsef et al. | 331/16 |

FOREIGN PATENT DOCUMENTS

EP 1460762 A1 9/2004

OTHER PUBLICATIONS

International Search Report dated Apr. 7, 2010.

* cited by examiner

*Primary Examiner* — James E Goodley
(74) *Attorney, Agent, or Firm* — Joseph Petrokaitis; Daryl K. Neff

(57) ABSTRACT

A phase locked loop ("PLL") includes a voltage controlled oscillator ("VCO") operable to acquire and maintain lock at a selected output frequency of the VCO and control logic operable to perform steps in a method of selecting a frequency band for operating the VCO. Such method can include switching the VCO to a given operating band from among the plurality of operating bands of the VCO; determining a band center frequency at which the VCO oscillates in the given operating band when the control voltage is set to a center of a range of minimum to maximum control voltages [CVmin, CVmax]; determining a difference between the band center frequency and the selected output frequency when the selected output frequency is within the given operating band; switching the VCO to another operating band; repeating the above steps until a difference between the band center frequency and the selected output frequency increases; and selecting the operating band for operation of the VCO for which the difference between the band center frequency and the selected output frequency is smallest.

16 Claims, 4 Drawing Sheets

AUTO-CALIBRATION FOR RING OSCILLATOR VCO

BACKGROUND OF THE INVENTION

1. Technical Field

The present invention relates to oscillator circuits and related methods, especially phase locked loops with ring oscillators.

2. Description of Related Art

Phase-locked loops ("PLLs") which incorporate voltage-controlled oscillators ("VCOs") are used in a variety of applications, such as to perform channel selection and associated tuning in frequency-division multiplexed systems for radio, television, cable and satellite broadcast systems. In particular cases, the phase-locked loop may need to maintain the frequency output by a voltage-controlled oscillator ("VCO") for a very long period of time. In a serial data transmission system which can be implemented in an integrated circuit of a semiconductor element such as a chip, for example, transmission and receiving frequencies may need to remain locked over an entire operating lifetime of the chip.

FIG. 1 is a block and schematic diagram illustrating a PLL 30 with coarse calibrating circuitry in accordance with the prior art. The VCO 32 includes a linear amplifier LA and a resonator including an LC tank circuit. A reference clock frequency (REFCLK) and a divider setting (% N) set the output frequency fL to be maintained by the VCO 32. In some applications such as for use in an intrasystem or inter-system serial data communications receiver, the PLL is expected to remain locked at a single output frequency fL over the entire lifetime of the PLL and the chip in which it is incorporated. In such case, the settings REFCLK and % N remain fixed throughout the lifetime of the chip. Viewed from left to right in FIG. 1, the PLL incorporates a phase-frequency discriminator PFD which produces an error signal 34 based on the difference between the frequencies of REFCLK and a feedback clock signal FBCLK obtained by dividing the output frequency fL with divider (% N). The error signal, typically in form of pulses, is input to a charge pump QP. The charge pump QP integrates the pulses and outputs a signal which is conditioned by a low-pass filter (LPF) to produce a control voltage CV at the input to the VCO 32. For coarse calibration, the charge pump QP produces a common mode voltage level CMV which is a neutral value of the control voltage.

The common mode voltage CMV and the control voltage CV are input to a coarse calibration circuit 36 which contains first and second comparators CN and CP and a circuit 38 to determine a minimum value CVmin and a maximum value CVmax that the control voltage can reach during operation of the PLL. The output COMPM of Comparator CN is activated when CV falls below CVmin. The output COMPP of Comparator CP is activated when CV rises above CVmax. During a coarse calibration operation, these signals COMPN and COMPP indicate whether the control voltage CV falls below the voltage CVmin, is between CVmin and CVmax, or rises above CVmax.

As further shown in FIG. 1, a PLL logic block 40 controls operation of the PLL by selecting the frequency band of the VCO operation through a band selection signal VBAND-SEL<3:0> provided to the LC Tank circuit. During coarse calibration, REFCLK and the % N inputs are established and maintained and the PLL logic 40 sets the LC Tank to a given frequency band, which may be the lowest frequency band for the PLL. The PLL then begins operating at a given control voltage CV, which can be at the low end of its range, i.e., at around CVmin. As the PLL then works to make FBCLK equal to REFCLK, the control voltage CV increases over time by operation of the phase frequency discriminator PFD and the charge pump QP. If COMPP becomes active, indicating that CV exceeds CVmax, the required output frequency fL is not found within the selected frequency band. The PLL logic then selects a different frequency band, typically the next higher frequency band, and then performs the foregoing actions again with such frequency band to determine if the required frequency fL can be attained and locked within that frequency band. On the other hand, if the required frequency fL is achieved and the current control voltage value is not beyond the low end CVmin or high end CVmax of its range, a lock point, i.e., the required output frequency, can be achieved within the currently selected frequency band of the PLL.

However, even when the lock point is detected to be within one of the operating frequency bands of the PLL, coarse calibration operation is not finished yet. The PLL illustrated in FIG. 1 is designed to determine the frequency band for which the final control voltage is nearest to the neutral level (the common mode voltage CMV). Thus, when such lock point is detected, the current value of the control voltage CV is saved by the PLL logic 40, as well as signals representing the current CVmax and CVmin values. After the lock point is detected in one operating frequency band, the PLL is switched to one or more other operating frequency bands and the foregoing actions are repeated to determine whether the lock point is achieved within such other operating frequency bands. When the lock point is detected, the current value of the control voltage CV is again saved by the PLL logic 40, as well as signals representing the current CVmax and CVmin values. When all the frequency bands have been determined in which the lock point is achieved, the PLL logic then selects an operating frequency band for which the lock point is closest to the center of the range between CVmin and CVmax for that operating frequency band. The PLL then begins operating with that selected frequency band and is intended to stay within that selected band.

Further improvements are desirable in relation to background systems and methods.

SUMMARY OF THE INVENTION

A method of operating a voltage controlled oscillator ("VCO") is provided in accordance with an aspect of the invention. Such method can include switching the VCO to a given operating band from among the plurality of operating bands of the VCO. Then, a band center frequency can be determined at which the VCO oscillates in the given operating band when the control voltage is set to a center of a range of minimum to maximum control voltages [CVmin, CVmax]. When the selected output frequency is within the given operating band, a difference can be determined between the band center frequency and the selected output frequency. The VCO may then be switched to another operating band. The foregoing steps (b), (c) and (d) can be repeated until a difference between the band center frequency and the selected output frequency increases. An operating band can be selected for operation of the VCO for which the difference between the band center frequency and the selected output frequency is smallest.

In accordance with another aspect of the invention, a phase locked loop ("PLL") can include a voltage controlled oscillator ("VCO") operable to acquire and maintain lock at a selected output frequency of the VCO and control logic operable to perform steps in a method of selecting a frequency band for operating the VCO. Such method can include switching the VCO to a given operating band from among the plurality of operating bands of the VCO; determining a band center frequency at which the VCO oscillates in the given operating band when the control voltage is set to center of a range of minimum to maximum control voltages [CVmin, CVmax]; determining a difference between the selected output frequency and the band center frequency when the selected output frequency is within the given operating band; switching the VCO to another operating band; repeating the above steps until a difference between the selected output frequency and the band center frequency increases; and selecting the operating band for operation of the VCO for which the difference between the selected output frequency and the band center frequency is smallest.

In accordance with another aspect of the invention, a phase locked loop ("PLL") is provided, which can include a voltage controlled oscillator ("VCO") operable to acquire and maintain lock at a selected output frequency of the VCO; and control logic operable to select a frequency band for operating the VCO. The control logic can be operable to switch the VCO to a given operating band from among the plurality of operating bands of the VCO. The control logic can then determine a band center frequency at which the VCO oscillates in the given operating band when the control voltage is set to a center of a range of minimum to maximum control voltages [CVmin, CVmax]. The control logic may determine a difference between the selected output frequency and the band center frequency when the selected output frequency is within the given operating band. Then, the control logic can switch the VCO to another operating band. In addition, the foregoing acts of the control logic can be repeated until a difference between the band center frequency and the selected output frequency increases. An operating band for operation of the VCO can be selected for which the difference between the band center frequency and the selected output frequency is smallest.

DETAILED DESCRIPTION

In accordance with an embodiment of the invention, a simplified phase-locked loop ("PLL") is provided in which complex circuitry for calibrating the PLL can be eliminated.

Figure 1:
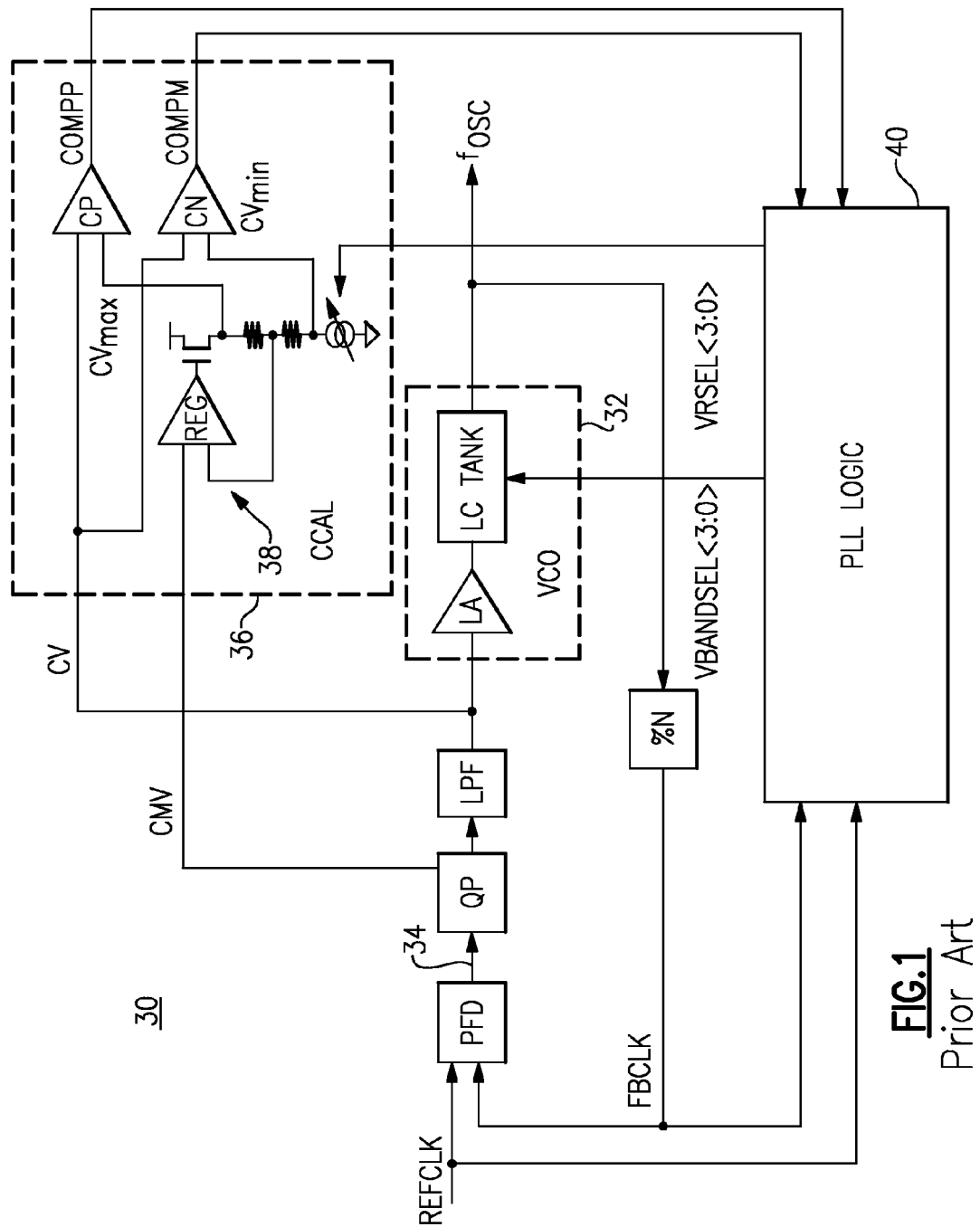
FIG. 1 is a block and schematic diagram illustrating a phase-locked loop ("PLL") in accordance with the prior art.
Figure 2:
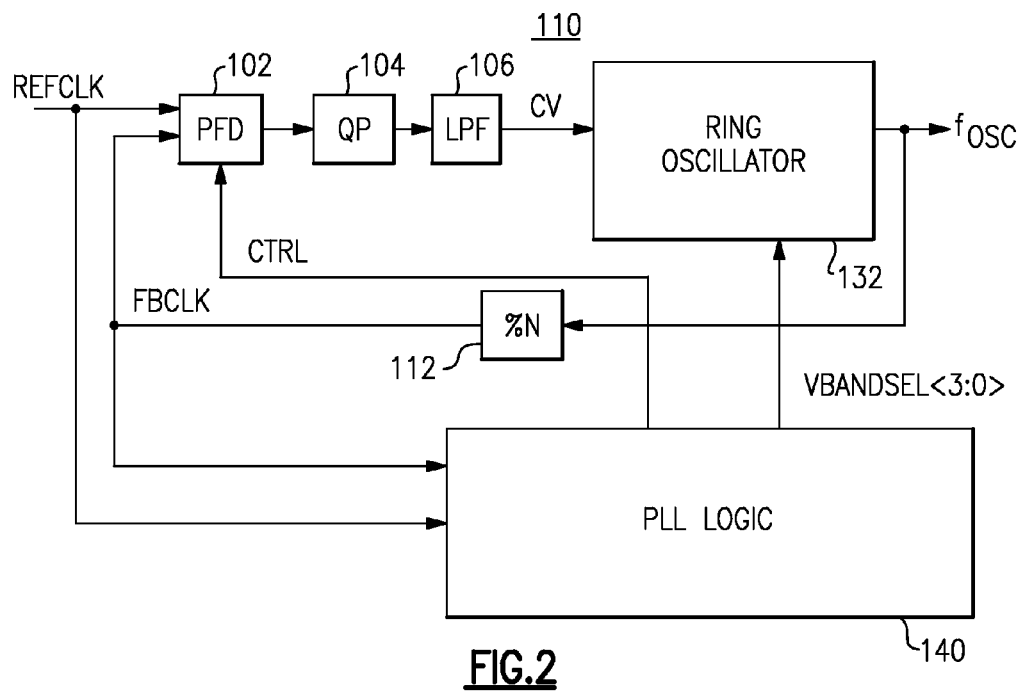
FIG. 2 is a block and schematic diagram illustrating a PLL in accordance with an embodiment of the invention.

A PLL 110 including a ring oscillator 132 and methods according to embodiments described herein are simplified in relation to the prior art PLL discussed above with reference to FIG. 1. Elements of the coarse calibration circuit CCAL 36 (FIG. 1) such as the regulator REG, and comparators COMPP and COMPN are eliminated from the PLL 110 (FIG. 2). Simpler operation is achieved because a difference between a band center frequency and a selected output frequency need only be recorded and the operating band selected for which the smallest difference exists between the selected output frequency and the band center frequency.

The PLL (FIG. 2) and the circuits and methods described herein achieve benefits and advantages which will be apparent from the following description. Components including the charge pump QP 104, low-pass filter LPF, and divider % N 112 are similar in structure and operation to the corresponding components of the PLL described above with reference to FIG. 1. However, instead of the LC tank type VCO (FIG. 1), the PLL includes a ring oscillator type VCO 132 instead. A characteristic of ring oscillator VCOs is that they have a linear relationship between a control voltage CV and the output frequency $f_{OSC}$. Because of this linear relationship, the output frequency of the ring oscillator VCO can be known as a function of the control voltage. Stated another way, the output frequency $f_{OSC}$ in a given operating band of the ring oscillator VCO is linearly related to the variable control voltage CV in accordance with an equation such as:

$$f_{OSC} = m(CV) + f(CV=0),$$

where CV is allowed to vary over a range CV,min<CV<CV,max where CV,min is a negative voltage value and CV,max is a positive value, m is a constant at least for the particular operating band of the VCO and f(CV=0) represents the output frequency $f_{OSC}$ when the control voltage is set to zero volts. In addition, the value of CV-CV,min may be the same as CV,max-CV. In this case, when the control voltage CV is equal to zero, CV will be precisely centered within the range [CV,min, CV,max]. As a result, when CV is set to zero, the band center frequency fc generated by the VCO using CV=0 is precisely centered within the range [Fmin, Fmax] of frequencies $f_{OSC}$ that the ring oscillator 132 (FIG. 2) can output when in the given operating band. These characteristics of the ring oscillator allow a simplified PLL and auto-calibration method to be used in accordance with an embodiment of the invention.

Referring again to FIG. 2, the PLL 110 according to an embodiment of the invention omits the coarse calibration circuit 36 of the prior art PLL (FIG. 1), as well as the regulator circuit 38 (FIG. 1) and the comparators COMPM and COMPP. The PLL 110 contains a modified phase frequency discriminator PFD 102 and adds a new control signal CTRL for operating the PFD. The PFD 102 now accepts the control signal CTRL which forces the phase frequency discriminator to the center frequency fc, which is center the frequency range [Fmin, Fmax] of output frequency $f_{OSC}$ for the given operating band.

When the CTRL signal is asserted, the minimum PFD output level drives the control voltage CV at the input to the VCO 132 to its minimum level. As a result, the output frequency $f_{OSC}$ of the PLL 110 is driven to the center frequency fc for the selected frequency band of operation. When $f_{OSC}$ is at the center frequency fc, the PLL logic 140 stores a numerical value representative of the center frequency fc. The CTRL signal can then be disabled and the PLL can be allowed to lock at the selected output frequency selected in accordance with the divider % N 112 and the band selection via control logic. When the PLL locks at the selected output frequency, the selected output frequency is a lock frequency fL within the selected band. The PLL will lock as long as the selected output frequency is within the currently selected operating band of the ring oscillator. The PLL logic records a difference value representative of a difference between the band's center frequency fc and the lock frequency fL. A goal of the method can be to find the frequency band for which the difference between the center frequency fc and the lock frequency fL is the smallest.

After recording the result for the current operating band, the PLL logic then switches the VCO 132 to a next frequency band of operation and repeats the foregoing steps in order to determine the center frequency fc of that next operating band and the difference between that center frequency and the lock frequency in that band. The process continues until the operating band is identified which has the center frequency fc with the least difference from the lock frequency fL. The VCO then is operated using the identified frequency band. In so doing, the VCO is operated with a frequency band which can tolerate changes in temperature and other operating conditions or device properties without losing lock and having to re-calibrate to select another frequency band because of such changes.

Figure 4:
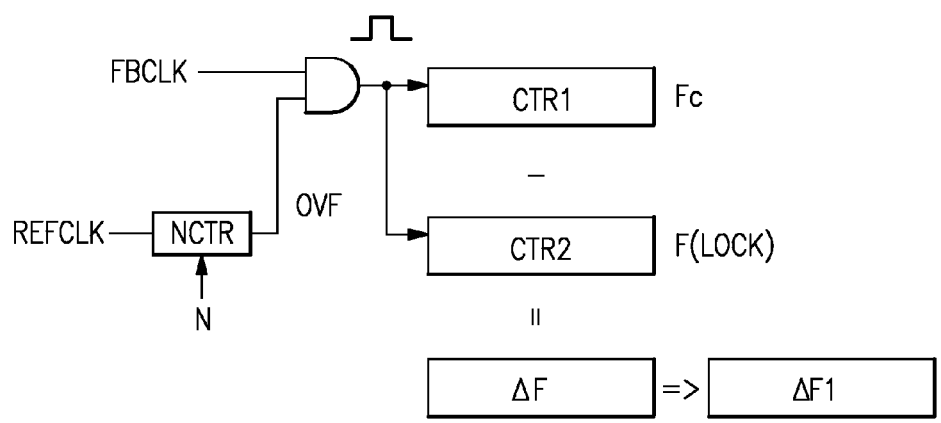
FIG. 4 is a schematic diagram illustrative of operation of a PLL in accordance with an embodiment of the invention.
Figure 3:
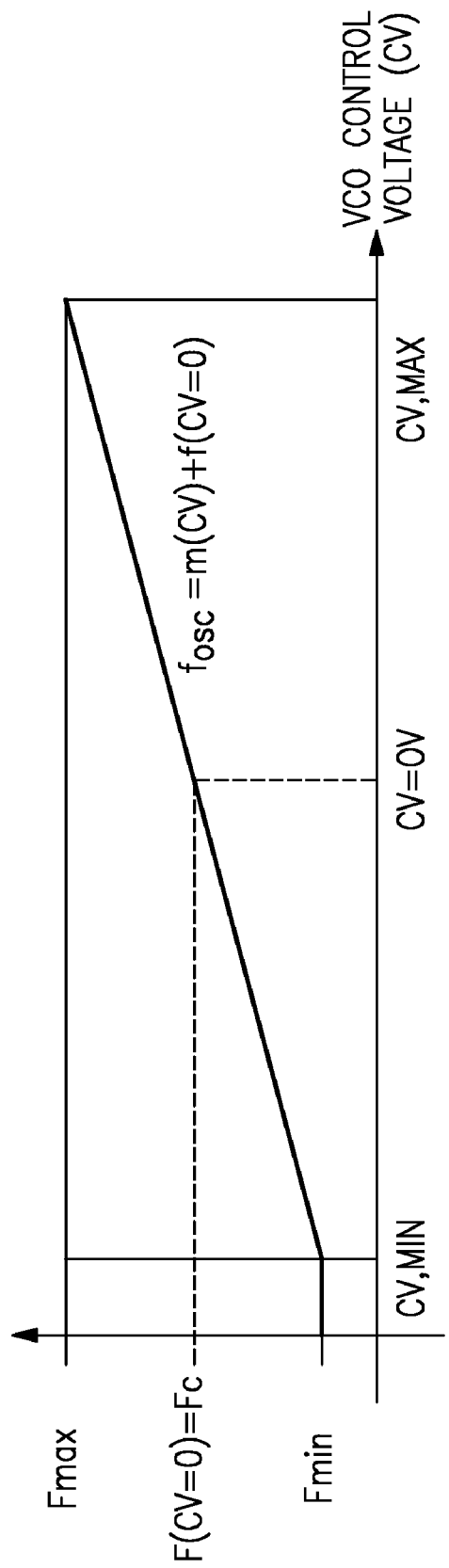
FIG. 3 is a graph illustrating a voltage-frequency transfer function of a ring oscillator incorporated, for example, in a PLL (FIG. 2) in accordance with an embodiment of the invention.

FIG. 4 is a diagram illustrating operations performed by the PLL logic 140 in accordance with a particular embodiment of the invention in determining the frequency band for which the difference Δf between fc and fL is the smallest. As depicted in FIG. 4, the reference frequency REFCLK is input to a counter NCTR which produces an overflow bit OVF each time NCTR reaches the maximum count. The OVF bit then is used to gate the FBCLK (frequency divided down from $f_{OSC}$) into the counter by ANDing OVF with FBCLK. This technique produces a count representative of the frequency of FBCLK over a number 'N' of REFCLK cycles. The VCO is set to operate in a selected operating band and the resulting pulses are input to a first counter CTR1 which counts the number of pulses in a period of time having a given length. Then, while not asserting the CTRL signal to the PFD, the PLL is allowed to reach the locking frequency and then determines a representative count value for the locking frequency fL by counting the FBCLK pulses via a counter CTR2 when the PLL is locked over a period of time having the same (given) length.

When the PLL achieves lock within the selected operating band, a current difference value Δf=|fc−fL| is determined between the center frequency fc and the lock frequency fL, which is the selected output frequency. For later use, a difference value Δf1 is initialized with the current difference value Δf and saved. Another frequency band of operation, which can be the next higher frequency band, for example, then is selected for the VCO to operate. The above-described process then is repeated for the other frequency band to determine the difference value Δf for that frequency band. If the most recent Δf value is smaller than the saved difference value Δf1, then the most recent difference value Δf is saved as Δf1. The VCO is again set to another frequency band, such as the next higher frequency band, and the above-described process is again repeated for such frequency band. Again, it is determined whether the most recent difference value Δf is smaller than the saved difference value Δf1. If so, the current difference value Δf is saved as Δf1.

These steps are repeated at least until the current difference value Δf becomes larger than the saved difference value Δf1. When that is the case, the PLL logic sets the VCO to the frequency band which had the smallest difference value Δf. The frequency band with the smallest difference value Δf is usually the most recently tested frequency band prior to the current difference value Δf becoming greater than the saved difference value Δf1. The VCO then remains set at that frequency band during normal operation. Note that the counter representing the frequency fL which was stored in CTR2 above is actually the value of N. Thus, N can be subtracted from the value in CTR1 to yield Δf=|fc−fL| in CTRA. A second register can be used to save the Δf1 value for later comparisons, such register being reassigned with the current difference value Δf whenever the current difference value is smaller than the saved difference value Δf1.

Figure 5:
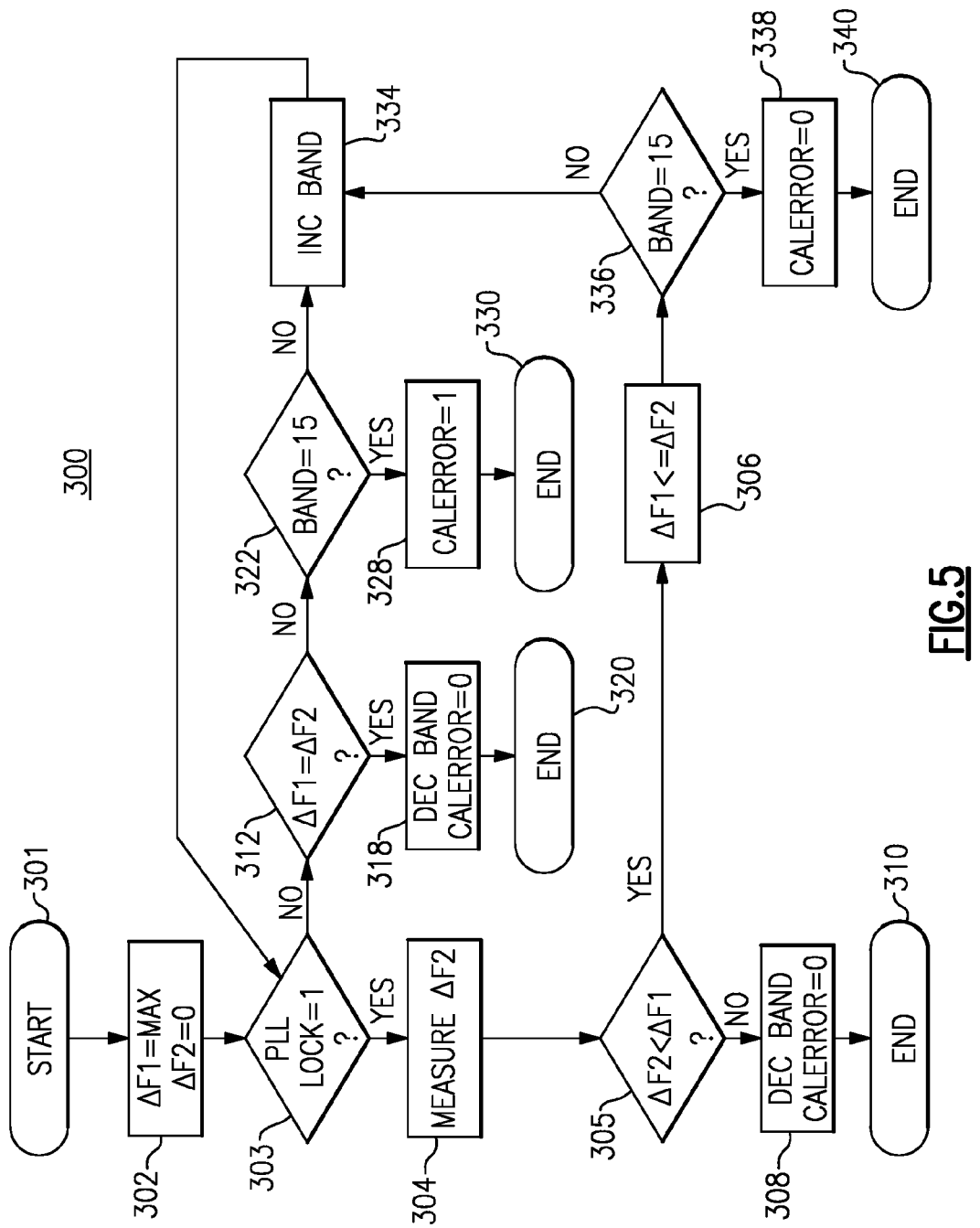
FIG. 5 is a flow diagram illustrating a method of calibrating a PLL in accordance with an embodiment of the invention.

Referring to FIG. 5, a method 300 in accordance with an embodiment of the invention will now be described for calibrating the PLL 110 (FIG. 2), i.e., for selecting a frequency band for operating the VCO. In the calibration method illustrated in FIG. 5, four possible endpoints 310, 320, 330 and 340 are shown. Endpoints 310, 320 and 340 represent success in determining a correct frequency band of operation, in that each endpoint 310, 320 and 340 is preceded by a determination that the calibration method is not in error, as indicated by the reference CALERROR=0 in blocks 308, 318 and 338. On the other hand, at endpoint 330 the method terminates on error as indicated by CALERROR=1 in block 328. For purposes of the following description, the PLL is assumed to have 16 frequency bands of operation numbered from 0 to 15. Of course, the PLL can have a greater number or smaller number of frequency bands without affecting the principles of operation of the herein-described method.

After starting operation (block 301), at block 302, the method begins by initializing the value of Δf1 to a maximum value, Δf1 being a value that will track the smallest detected difference in frequency between the center frequency and the lock frequency (fc−fL). Also, a value Δf2 is set to zero, such value representing the difference in frequency ($f_{OSC}$−fL) for the current frequency band of operation previously described as Δf. The PLL then is set to operate in the lowest frequency band, at which time the PLL scans through the frequency band, determines the true center frequency fc, such as by following the above-described method (FIG. 4) and determines the lock frequency fL, within that frequency band, when the selected output frequency is within the current frequency band. At block 303, if the PLL achieves lock within the frequency band, then the condition PLL Lock=1 is true, and operation now continues at block 304 in which the current difference value fc−fL is determined and is assigned to the value Δf2. Subsequently, in block 305 a determination is made whether Δf2 is less than Δf1. The first time this check is made, Δf2 must be less than Δf1 because Δf1 was initialized to the maximum value. In block 306, the current difference value of Δf2 is now assigned to Δf1 to be used subsequently.

Next, at block 336, it is determined whether the highest frequency band (band 15) has been reached. If true, then the frequency band having the smallest difference value Δf2 must have already been found. Therefore, the calibration method ends successfully (CALERROR=0) (block 338) and the method terminates (block 340). However, when the highest frequency band has not been reached, operation continues by selecting the next higher frequency band of operation (INC Band), as indicated at block 334. The center frequency fc and the lock frequency fL for the next band are then determined again in a manner as previously described.

At block 303, if the PLL is able to achieve lock within that frequency band, the current difference value Δf2 (difference between current values of fc and fL) is determined (block 304) and again it is determined whether the current difference value Δf2 is less than the previously saved difference value Δf1 (block 305). If the current difference value Δf2 is not smaller than the saved difference value Δf1, then it is determined that the frequency band having the smallest difference value has already been found. Here, the frequency band selection is returned to the most recent previous value, i.e., the frequency band immediately below the currently selected frequency band, as indicated by the words "Dec Band" in block 308. The method is indicated to be successful (CALERROR=0) in block 308 and the method then terminates (block 310).

Block 312 is reached when the PLL is unable to achieve lock within the selected frequency band. Here, a check is made to determine whether Δf1 is equal to Δf2. If the values are equal, then it is determined that the frequency band having the smallest difference value has already been found. The frequency band selection is returned to the most recent previous value, i.e., the frequency band immediately below the currently selected frequency band, as indicated by the words "Dec Band" in block 318. The method is indicated to be successful (CALERROR=0) in block 318 and the method then terminates (block 320).

When Δf1 is not equal to Δf2, at block 322 a check is then made whether the highest frequency band (Band=15) has been reached. When that is true, this indicates that a frequency band has not yet been determined in which lock was achieved (block 328). Therefore, it is clear that the calibration method has resulted in error (CALERROR=1) and the method then terminates (block 330).

However, when it is determined at block 322 that the highest frequency band has not yet been reached, operation then continues at block 334. The PLL is set to the next higher frequency band and operation continues at block 303, as described above, until the frequency band is determined for which the smallest difference value is obtained between the center frequency fc and the lock frequency fL.

While the invention has been described in accordance with certain preferred embodiments thereof, many modifications and enhancements can be made thereto without departing from the true scope and spirit of the invention, which is limited only by the claims appended below.

What is claimed is:

1. A method of operating a phase-locked loop ("PLL") including a voltage controlled oscillator ("VCO"), comprising:
    a) switching the VCO to an operating band selected from among the plurality of operating bands of the VCO;
    b) measuring a true center frequency at which the VCO oscillates in the selected operating band according to minimum and maximum frequencies corresponding respectively to minimum and maximum control voltages [CVmin, CVmax] by counting pulses in feedback from the output frequency of the VCO;
    c) allowing the PLL to lock the output frequency at a lock frequency when the lock frequency is within the selected operating band, and measuring the lock frequency by counting pulses in feedback from the lock frequency and determining a current difference between the measured true center frequency and the measured lock frequency; and
    d) so long as the current difference between the measured lock frequency and the measured true center frequency does not increase, switching the VCO to another operating band selected from among the plurality of operating bands of the VCO and repeating steps (b) and (c), otherwise setting the VCO to the operating band for which the difference between the measured lock frequency and the measured true center frequency is smallest, so as to select the operating band for which the measured lock frequency is closest to the true center of the frequency range of any of the operating bands, even if the output frequency of the VCO is a nonlinear function of the control voltage.

2. A method as claimed in claim 1, wherein the measured true center frequency is centered within a range of minimum to maximum oscillator frequencies for the operating band.

3. A method as claimed in claim 1, wherein the control voltage has a value of zero volts when it is set to a center of the range [CVmin, CVmax].

4. A method as claimed in claim 1, further comprising:
    operating the VCO in a locked condition with the selected operating band of the VCO having the smallest difference value, such that a phase locked loop ("PLL") in which the VCO operates maintains the locked condition over the operating lifetime of an apparatus in which the PLL is incorporated, notwithstanding variation in at least one of temperature, operating condition and a condition of a device of said PLL.

5. A method as claimed in claim 1, wherein the VCO includes a ring oscillator.

6. A phase locked loop ("PLL"), comprising:
    a voltage controlled oscillator ("VCO") operable to acquire and maintain lock at a selected output frequency of the VCO; and
    control logic operable to perform steps in a method of selecting a frequency band for operating the VCO, the method including:
    a) switching the VCO to an operating band selected from among the plurality of operating bands of the VCO;
    b) measuring a true center frequency at which the VCO oscillates in the selected operating band according to minimum and maximum frequencies corresponding respectively to minimum and maximum control voltages [CVmin, CVmax] by counting pulses in feedback from the output frequency of the VCO;
    c) allowing the PLL to lock the output frequency at a lock frequency when the lock frequency is within the selected operating band, and measuring the lock frequency by counting pulses in feedback from the lock frequency and determining a current difference between the measured true center frequency and the measured lock frequency; and
    d) so long as the current difference between the measured lock frequency and the measured true center frequency does not increase, switching the VCO to another operating band selected from among the plurality of operating bands of the VCO and repeating steps (b) and (c), otherwise setting the VCO to the operating band for which the difference between the measured lock frequency and the measured true center frequency is smallest, so as to select the operating band for which the measured lock frequency is closest to the true center of the frequency range of any of the operating bands, even if the output frequency of the VCO is a nonlinear function of the control voltage.

7. A PLL as claimed in claim 6, wherein the control voltage has a value of zero volts when it is set to the center of the range [CVmin, CVmax].

8. A PLL as claimed in claim 6, wherein the PLL is operable to maintain the locked condition over the operating lifetime of an apparatus in which the PLL is incorporated, notwithstanding variation in at least one of temperature, operating condition and a condition of a device of said PLL.

9. A PLL as claimed in claim 6, wherein the VCO includes a ring oscillator.

10. A PLL as claimed in claim 6, wherein the control logic is operable in response to a reference clock signal and a FBCLK oscillator signal divided down from the oscillator output frequency to determine the difference between the measured true center frequency and the measured lock frequency.

11. A phase locked loop ("PLL"), comprising:
    a voltage controlled oscillator ("VCO") operable to acquire and maintain lock at a selected output frequency of the VCO; and control logic operable to select a frequency band for operating the VCO, the control logic being operable to a) switching the VCO to an operating band selected from among the plurality of operating bands of the VCO;

b) measuring a true center frequency at which the VCO oscillates in the selected operating band according to minimum and maximum frequencies corresponding respectively to minimum and maximum control voltages [CVmin, CVmax] by counting pulses in feedback from the output frequency of the VCO;

c) allowing the PLL to lock the output frequency at a lock frequency when the lock frequency is within the selected operating band, and measuring the lock frequency by counting pulses in feedback from the lock frequency and determining a current difference between the measured true center frequency and the measured lock frequency; and d) so long as the current difference between the measured lock frequency and the measured true center frequency does not increase, switching the VCO to another operating band selected from among the plurality of operating bands of the VCO and repeating steps (b) and (c), otherwise setting the VCO to the operating band for which the difference between the measured lock frequency and the measured true center frequency is smallest, so as to select the operating band for which the measured lock frequency is closest to the true center of the frequency range of any of the operating bands, even if the output frequency of the VCO is a nonlinear function of the control voltage.

12. A PLL as claimed in claim 11, wherein the control voltage has a value of zero volts when it is set to the center of the range [CVmin, CVmax].

13. A PLL as claimed in claim 11, wherein the PLL is operable to maintain the locked condition over the operating lifetime of an apparatus in which the PLL is incorporated, notwithstanding variation in at least one of temperature, operating condition and a condition of a device of said PLL.

14. A PLL as claimed in claim 11, wherein the VCO includes a ring oscillator.

15. A PLL as claimed in claim 11, wherein the control logic is operable in response to a reference clock signal and a FBCLK oscillator signal divided down from the oscillator output frequency to determine the difference between the measured true center frequency and the measured lock frequency.

16. A method as claimed in claim 1, wherein the step of measuring the true center frequency includes storing the count of the pulses in a counter.

* * * * *